US008270170B2

(12) United States Patent
Hughes et al.

(10) Patent No.: US 8,270,170 B2
(45) Date of Patent: Sep. 18, 2012

(54) CONTACT COOLED ELECTRONIC ENCLOSURE

(75) Inventors: Phillip N. Hughes, Menlo Park, CA (US); Robert J. Lipps, Los Gatos, CA (US)

(73) Assignee: Clustered Systems Company, Santa Clara, CA (US)

( * ) Notice: Subject to any disclaimer, the term of this patent is extended or adjusted under 35 U.S.C. 154(b) by 217 days.

(21) Appl. No.: 12/535,272

(22) Filed: Aug. 4, 2009

(65) Prior Publication Data

US 2010/0027220 A1  Feb. 4, 2010

Related U.S. Application Data

(60) Provisional application No. 61/085,931, filed on Aug. 4, 2008.

(51) Int. Cl.
H05K 7/20 (2006.01)

(52) U.S. Cl. .......... 361/710; 361/702; 361/679.47; 361/679.52; 361/676; 361/688; 165/104.33; 62/259.2

(58) Field of Classification Search ......... 361/679.46–679.52, 676, 688, 361/700–710
See application file for complete search history.

(56) References Cited

U.S. PATENT DOCUMENTS

| 5,000,256 | A | * | 3/1991 | Tousignant | .............. 165/46 |
| 5,457,603 | A | | 10/1995 | Leeb | |
| 5,740,018 | A | | 4/1998 | Rumbut, Jr. | |
| 5,818,692 | A | | 10/1998 | Denney, Jr. et al. | |
| 5,991,155 | A | * | 11/1999 | Kobayashi et al. | ........... 361/705 |
| 6,064,572 | A | * | 5/2000 | Remsburg | ............. 361/700 |
| 6,104,611 | A | * | 8/2000 | Glover et al. | ............. 361/700 |
| 6,393,853 | B1 | | 5/2002 | Vukovic et al. | |
| 6,421,240 | B1 | * | 7/2002 | Patel | ............. 361/699 |
| 6,771,495 | B2 | * | 8/2004 | Fujiwara et al. | ......... 361/679.34 |
| 7,063,127 | B2 | | 6/2006 | Gelorme et al. | |
| 7,096,926 | B2 | | 8/2006 | Belady et al. | |
| 7,167,366 | B2 | | 1/2007 | Cheon | |
| 7,212,409 | B1 | | 5/2007 | Belady et al. | |
| 7,218,129 | B2 | | 5/2007 | Beaman et al. | |
| 7,250,674 | B2 | | 7/2007 | Inoue | |
| 7,286,355 | B2 | | 10/2007 | Cheon | |
| 7,403,393 | B2 | * | 7/2008 | Herring et al. | ............. 361/700 |

(Continued)

FOREIGN PATENT DOCUMENTS

| JP | 2002/280782 | 9/2002 |
| WO | WO-2009079012 A1 | 6/2009 |
| WO | WO-2010016890 A1 | 2/2010 |

OTHER PUBLICATIONS

"International Application Serial No. PCT/US2008/013880, International Search Report mailed Feb. 17, 2009", 4 pgs.

(Continued)

Primary Examiner — Courtney Smith
(74) Attorney, Agent, or Firm — Jeffrey Schox

(57) ABSTRACT

Various embodiments disclose a system and an associated method to provide cooling to a plurality of electronic components mounted proximately to one another in an electronic enclosure is disclosed. The system comprises a cold plate that is mounted on the electronic enclosure to conduct heat thermally. The cold plate has a first surface to mount proximate to the plurality of electronic components and a second surface to mount distal from the plurality of electronic components. One or more heat risers are configured to be thermally coupled between the first surface of the cold plate and at least one of the plurality of electronic components.

29 Claims, 8 Drawing Sheets

U.S. PATENT DOCUMENTS

| | | | |
|---|---|---|---|
| 7,663,883 B2 * | 2/2010 | Shirakami et al. | 361/700 |
| 7,916,485 B2 * | 3/2011 | Yu et al. | 361/710 |
| 2004/0032710 A1 * | 2/2004 | Fujiwara et al. | 361/685 |
| 2004/0052052 A1 * | 3/2004 | Rivera | 361/700 |
| 2004/0221604 A1 | 11/2004 | Ota et al. | |
| 2006/0070720 A1 | 4/2006 | Capp et al. | |
| 2007/0076376 A1 | 4/2007 | Mongia et al. | |
| 2008/0053640 A1 * | 3/2008 | Mok | 165/104.33 |
| 2008/0122566 A1 | 5/2008 | Tegart | |
| 2009/0159241 A1 | 6/2009 | Lipp et al. | |

OTHER PUBLICATIONS

"International Application Serial No. PCT/US2008/013880, Written Opinion mailed Feb. 17, 2009", 5 pgs.

"International Application Serial No. PCT/US2009/004462, Search Report mailed Sep. 21, 2009", 4 pgs.

"International Application Serial No. PCT/US2009/004462, Written Opinion mailed Sep. 21, 2009", 8 pgs.

* cited by examiner

Not to scale

CONTACT COOLED ELECTRONIC ENCLOSURE

CROSS-REFERENCE TO RELATED APPLICATIONS

This application claims priority benefit of U.S. Provisional Application No. 61/085,931, entitled, "A Contact Cooled Electronic Enclosure," filed Aug. 4, 2008, which is hereby incorporated by reference in its entirety.

TECHNICAL FIELD

The present application relates generally to the cooling of compute and storage systems; and, in a specific exemplary embodiment, to a system and method for cooling electronic equipment in modularly deployed systems cooled by attachment to a cold plate.

BACKGROUND

In a variety of contemporaneous applications, various types of fluid-based cooling systems cool computers and other electronic equipment. In the simplest case, fluid moves heat from a hard-to-cool location to a different area. For example, flexible fluid-filled heat pipes are employed to remove heat from hot electronic components to finned sides of a computer case where convective cooling with ambient air removes the heat without the use of forced air.

Enterprise-based compute and storage systems are increasingly deployed as modular systems with standardized form factor electronic enclosure modules mounted in standardized support structures. The standardized electronic enclosure modules can be devoted to perform any of a number of different functions such as computing, storage, or networking. The enclosure modules are commonly mounted in standardized support structures such as 19 inch (approximately 0.482 m) or 24 inch (approximately 0.610 m) wide racks. Such enclosures are commonly industry standard 1U (1.75 inch; approximately 4.45 cm), 2U (3.5 inch; approximately 8.89 cm), 3U (5.25 inch; approximately 13.3 cm), or 4U (7 inch; approximately 17.8 cm) high. Often, the reasons for the adoption of the larger 2U, 3U, or 4U modules are to increase reliability of electronic components through improved airflow for cooling and to provide space for more adapter cards.

Modular enclosures are frequently air-cooled. The enclosures draw air in from the room in which they are housed by means of fans that accelerate the air and force it over the enclosure's internal components, thus cooling the components. The resulting heated air is exhausted back into the room.

Other cooling methods have focused on fluid cooled systems using a cold plate means. The cold plate means are typically complex. For example, an individual spring-loaded cold plate is used for each component. Each cold plate, in turn, is connected with individual flexible pipes. Each cold plate includes, at least, a temperature-controlled valve, temperature sensors, and controllers.

Other cooling methods have employed a compressible thermally-conductive-material heat sink assembly. To be compressible, the heat sink assembly must conform to components to be cooled. However, all conformable materials have a relatively low thermal conductivity as compared to pure metals or heat pipes. Thus, the conformable heat sink assemblies have a relatively high thermal resistance. Consequently, very little heat spreading is provided such that each thermal interface must have a very low thermal resistance for the assembly to be effective. Further, the assembly is not extensible to vertical daughter cards on a motherboard such as, for example, dual in-line memory modules (DIMMs) used in computer and other memory systems.

Importantly, no existing solution comprises a conventional, modularly deployed system with a high thermal conductivity connectable to all components. Further, no such system also includes high heat dissipation on a conventional motherboard, including removable daughter and memory cards, to a common cold plate. Moreover, such a system should also be readily serviceable. Additionally, no solution proposes thermally connecting all such high heat dissipation devices to a common cooling plate by thermal elevation and co-planarization to a side of the enclosure. None of the existing systems further includes an easily serviceable system accessible through a removable lid as part of the heat removal system.

BRIEF DESCRIPTION OF DRAWINGS

Various ones of the appended drawings merely illustrate exemplary embodiments of the present invention and must not be considered as limiting a scope of the present invention.

DETAILED DESCRIPTION

Figure 1:
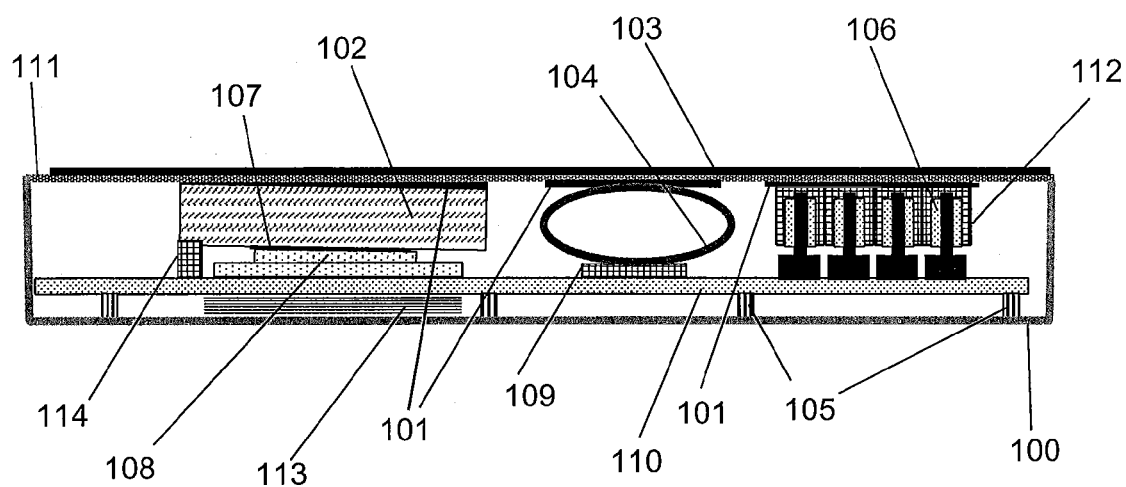
FIG. 1 is a cross-sectional drawing illustrating an exemplary embodiment of an enclosure with heat risers and thermal interface materials (TIMs)

The description that follows includes illustrative systems, methods, and techniques that cover various exemplary embodiments defined by various aspects of the present disclosure. In the following description, for purposes of explanation, numerous specific details are set forth in order to provide an understanding of various embodiments of the inventive subject matter. It will be evident, however, to those skilled in the art that embodiments of the inventive subject matter may be practiced without these specific details. Further, well-known instruction instances, protocols, structures, and techniques have not been shown in detail.

As used herein, the term "or" may be construed in an inclusive or exclusive sense. Similarly, the term "exemplary" may be construed merely to mean an example of something or an exemplar and not necessarily a preferred means of accomplishing a goal. Additionally, although various exemplary embodiments discussed below focus on a thermal cooling system for electronic components, the embodiments are merely given for clarity in disclosure. Thus, any type of thermal cooling application is considered as being within a scope of the present invention.

Disclosed herein is a comprehensive system for adapting conventional electronic enclosures, components, motherboards, subassemblies, and similar components to conductive cooling systems. Also described herein are methods and structures to calculate and thermally couple electronic components or subassemblies housed in the conventional electronic enclosures though a side of the enclosure to a proximate cold plate. In a specific exemplary embodiment, the cold plate comprises a lid of the enclosure. In another specific exemplary embodiment, the lid contacts an external cold plate therein taking at least a portion of the function of the cold plate itself.

The electronic components, subassemblies, or similar components are thermally elevated, planarized, and coupled, by means of heat risers and thermal interface materials (TIMs), to a side of the enclosure that, in turn, contacts a proximate cold plate. The enclosures may be the common electronic enclosures described above, other form-factor enclosures, or unenclosed systems such as server blades or bare server motherboards. Each of these components are known independently in the art.

The contact-cooled enclosure described herein can, among other things, comprise an instantiation of the contact-cooled enclosure referred to in a previously filed patent application by Lipp and Hughes. The patent application describes a rack mounted cold plate system is found in U.S. Provisional Patent Application No. 61/008,136, entitled "A Cooling System for Contact Cooled Electronic Modules," filed Dec. 19, 2007, and U.S. patent application Ser. No. 12/339,583, having the same title, and filed Dec. 19, 2008, both of which are incorporated herein by reference in their entirety.

In an exemplary embodiment, a system to provide cooling to a plurality of electronic components mounted proximately to one another in an electronic enclosure is disclosed. The system comprises a cold plate to mount on the electronic enclosure and thermally conduct heat. The cold plate has a first surface to mount proximate to the plurality of electronic components and a second surface to mount distal from the plurality of electronic components. One or more heat risers are configured to be thermally coupled between the first surface of the cold plate and at least one of the plurality of electronic components.

In another exemplary embodiment, a system to provide cooling to a plurality of electronic components mounted proximately to one another in an electronic enclosure is disclosed. The system comprises a cold plate to provide thermal heat conduction. The cold plate is configured to be mounted external to the electronic enclosure. One or more heat risers is configured to be thermally coupled on a first end to at least one of the plurality of electronic components. A lid, configured to be mounted on the electronic enclosure, has a first surface to mount proximate to the plurality of electronic components and a second surface to mount distal from the plurality of electronic components. The lid has a plurality of holes positioned to accommodate the one or more heat risers to poke through the lid. A layer of thermal interface material thermally couples a second end of the one or more heat risers to the cold plate.

In another exemplary embodiment, a method for thermally coupling a plurality of heat generating components in an electronic enclosure to a cold plate is disclosed. The method comprises calculating a power dissipation of each of the plurality of heat generating components, determining an acceptable temperature rise between the cold plate and the plurality of heat generating components, and determining an acceptable thermal impedance to maintain the acceptable temperature rise. A surface area of the cold plate needed to conduct heat from each of the plurality of heat generating components is calculated. A type of heat riser selected for each of a plurality of heat risers is determined based on the thermal impedance where at least one of the plurality of heat risers is associated with each of the plurality of heat generating components.

In another exemplary embodiment, an apparatus to provide cooling to a plurality of electronic components is disclosed. The apparatus comprises a first layer of a first thermal interface material. The first thermal interface material has a first thermal conductivity. A second layer of a second compliant thermal interface material is joined to the first layer. The second compliant thermal interface material has a second thermal conductivity being lower the first thermal conductivity. In a specific exemplary embodiment, the first thermal interface material is joined to the second complaint thermal interface material, forming a bag. A thermally conductive fluid is encapsulated within the bag.

In a specific exemplary embodiment described herein, a system for thermally coupling one or more heat generating components in a 1U enclosure to, for example, the removable lid of the enclosure, is disclosed. The lid can be further coupled to an external cold plate for additional heat removal. Although the actual descriptions provided herein are limited to 1U enclosures, a skilled artisan will recognize that similar systems, methods, and means may be applied to other styles of enclosures of various styles and dimensions. In addition, upon reading the disclosure, the skilled artisan will further recognize that the heat may be coupled to a different side of the enclosure, other than the lid, such as the bottom. Coupling to a different side of the enclosure can be accomplished by rearranging various elements of the various embodiments described.

Overview

In an exemplary embodiment, described in detail below, one or more heat-generating components in an electronic enclosure are maintained at acceptable temperatures primarily through conduction cooling to a proximate cold plate through the lid of the enclosure. Heat is thermally coupled from the heat generating components to heat-risers or spreaders. The heat flux may be spread out over a larger area and further coupled through the enclosure lid to a cold plate for heat removal. Although heat and heat flux are the elements of interest, for purposes herein, power and power dissipation are sometimes used as a proxy for heat flux.

In an exemplary embodiment, a methodology to design a cooling mechanism for a given electronic component or components may start with calculating a design window. A physical implementation of the design can use information derived from the calculating steps.

In this exemplary embodiment, a design window can be calculated by identifying and quantifying (e.g., calculating) a power dissipation of all heat generating components that are not maintained at a sufficiently low temperature by natural convection and conduction cooling means. A maximum or acceptable temperature rise from the cold plate interface to the heat generating components is then determined. A maximum or acceptable allowable heat flux (or power) per unit area at the cold plate/enclosure interface is determined to maintain the maximum acceptable temperature rise. The heat flux per unit area is commonly referred to as the thermal impedance. A cold plate surface area required to conduct the heat to the cold plate is calculated for each the heat generating components. The cold plate surface area determines an overall thermal resistance between each of the components and the cold plate. Each of these calculations and associated governing equations are known independently in the art.

Physical Implementation

Once preliminary calculations are determined, a distance between each of the one or more components and the cold plate interface is determined. An additional spatial allowance is made for one or more TIMs, generally between each of the one or more components and the cold plate interface. However, in certain applications, TIMs may be placed between one or more of the components and an adjacent component as well. The one or more TIMs can be placed in various locations, as is described below. A type and size of each of the heat-risers or spreaders is determined based on the heat flux, spreading information, and distances between each of the one or more components and the cold plate. The heat-risers or spreaders are produced and installed. The heat-risers or spreaders are generally placed to be substantially coplanar with the cold plate interface with a thermally coupling between the heat-risers or spreaders between the cold plate interface with the one or more TIMs.

1U Enclosure Embodiments

A conventional motherboard is deployed in a 1U form factor electronic enclosure. The 1U electronic enclosure is nominally 1.75 inches (approximately 4.45 cm) high by 19 inches (approximately 0.482 m) wide by 24 inches (approximately 0.610 m) deep with a removable top lid in one embodiment. The enclosure may contain one or more of a compute server, a storage device, a network switch, a power supply, other electronic devices, or any combination, singly or multiply, thereof.

With reference to FIG. 1, an exemplary cross-sectional view of an electronic enclosure 100 includes a lid 111 and has a motherboard 110 mounted therein. The electronic enclosure 100 and the lid 111 may each be fabricated from thermally conductive materials, independently known in the art. The motherboard 110 carries some or all of the VLSI components (e.g., integrated circuits in addition to discrete electronic components) and most, if not all, auxiliary circuits. The motherboard 110 is coupled to the electronic enclosure 100 via a plurality of standoffs 105. The motherboard 110 acts as a heat sink for components attached thereon. Through convective and radiative heat transfer to the electronic enclosure 100, the motherboard 110 has sufficient heat dissipation to provide generally sufficient heat removal for lower-powered circuits. Heat dissipation from the motherboard 110 may be further enhanced by one or more layers of thermal interface material (TIM) 113 arranged between the motherboard 110 and one or more walls of the electronic enclosure 100. The one or more layers of the TIM 113 operate to bring the motherboard 110 into thermal contact with the electronic enclosure 100. An exterior side of the lid 111 can also be covered with a thin layer of a compliant TIM 103 to optimize contact with an external cold plate (not shown in FIG. 1).

In a specific exemplary embodiment, the compliant TIM 103 can comprise two layers laminated or otherwise joined together. The two layers can be joined at or near the edges, in a quilted pattern, or in various other fashions as will be recognizable to a skilled artisan. In this specific exemplary embodiment, the layers can be substantially comprised of polyester and aluminum; each layer being roughly about 0.7 mils (approximately 18 microns) in thickness. A skilled artisan will recognize that other thicknesses and materials can be readily employed. The substantially polyester layer provides strength and toughness to the compliant TIM 103 but the thermal conductivity is still high due to the relative thinness of the polyester layer. The substantially polyester layer surface also provides good thermal coupling from an external cold plate (not shown) to itself (i.e., the compliant TIM 103). The aluminum layer spreads the heat flux coupled to the polyester layer from/to the external heat source/cold plate, ensuring a more uniform heat flux to a proximate thermally conductive fluid and reducing the overall thermal impedance. In another specific exemplary embodiment, a dual-layer bag could be formed and be further reinforced with a third lamination (not shown directly but easily understandable to a skilled artisan) for strength, such as a porous fiberglass though which a thermally conductive fluid could flow, thus providing additional strength while maintaining good thermal conductivity. A variant of this dual-layer bag is described with reference to FIG. 8, below.

Higher power dissipation devices, in particular high-density (e.g., LSI, VLSI, ULSI, etc.) integrated circuit devices such as a CPU 108, a graphics chip 109, a memory 106, a power supply transistor 114, and inductors (not shown) require heat risers to provide a low thermal impedance path to a common plane as defined by, for example, the lid 111. The heat risers conduct heat to the lid 111 from a component that is, for example, from 0.9 inches (approximately 2.3 cm) to 1.3 inches (approximately 3.3 cm) below the lid 111. Consequently, in a specific exemplary embodiment, each of a plurality of heat risers 102, 104, 112 have an overall length of from about 0.9 inches (approximately 2.3 cm) to 1.3 inches (approximately 3.3 cm). Tops of the plurality of heat risers 102, 104, 112 are effectively planarized through the use of a plurality of riser TIMs 101 so that at least one of the plurality of heat risers 102, 104, 112 conforms to the lid 111. Minimizing thermal impedances from a high power dissipation device to the external cold plate (not shown) can be accomplished by spreading the heat flux over a larger area. For example, one of the plurality of heat risers 102, which is also a heat spreader, is designed to spread the heat flux over an area about ten times greater at its top thermal contact with one of the plurality of riser TIMs 101 to the lid 111 than at a bottom thermal contact 107 to the CPU 108. The ten times greater area thereby reduces the heat flux and thermal gradient across one of the plurality of riser TIMs 101, the lid 111, and the compliant TIM 103 by a factor of about ten. The reduction in heat flux due to the greater area is more fully described under VLSI cooling below. As will be recognized by a skilled artisan upon reading the disclosure, a heat riser may be used to carry the heat away from more than one component. For example, one of the plurality of heat risers 102 is also in thermal contact with the power supply transistor 114, transporting heat generated therein, along with heat from the CPU 108 to the lid 111.

Figure 2:
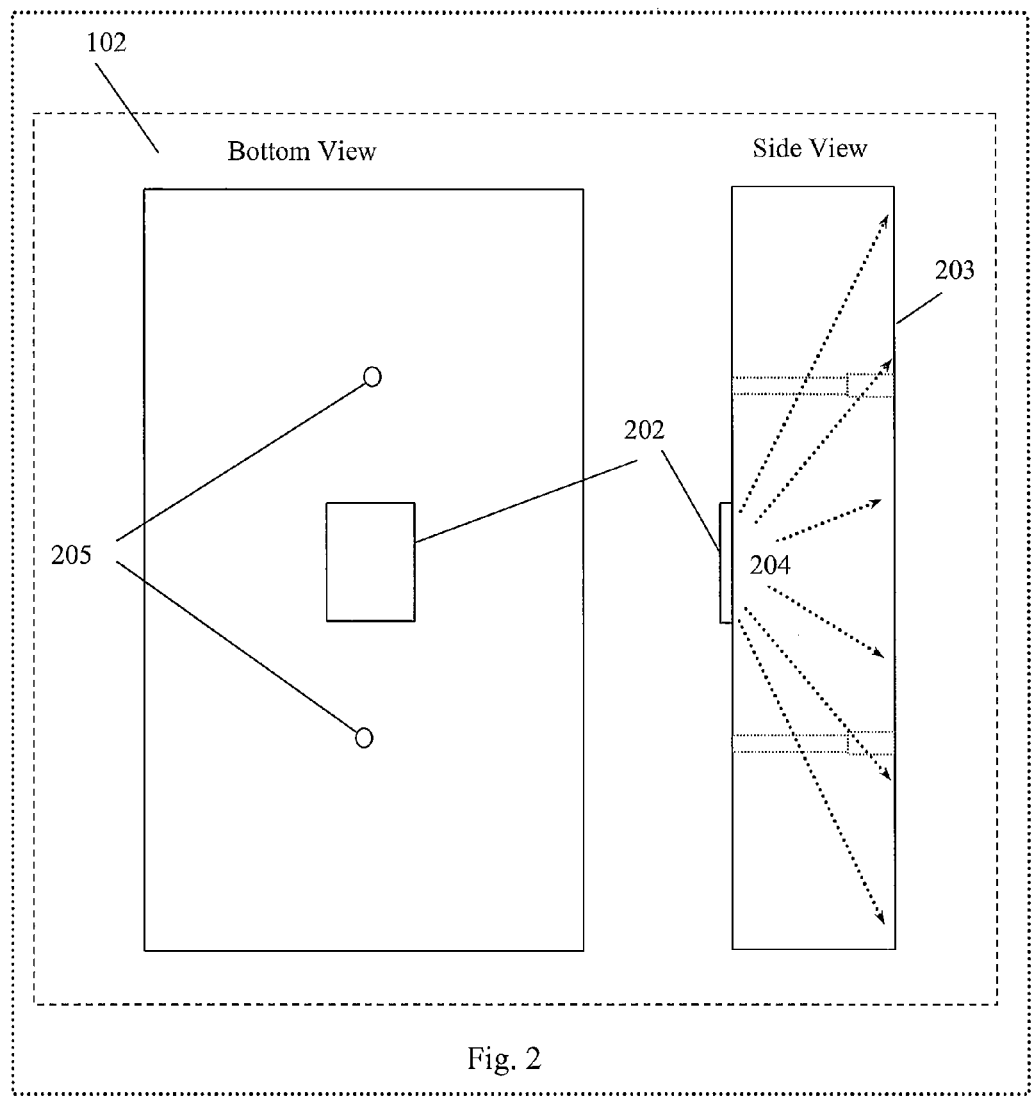
FIG. 2 is a bottom and side view of an exemplary embodiment of a heat-riser/spreader made from a highly thermally-conductive material such as a block of metal.

Thermal paths for high dissipation, high heat flux integrated circuit devices (e.g., devices fabricated according to VLSI or ULSI design principles) are provided by combination heat-risers/spreaders. Such heat-risers/spreaders have top surfaces from about two to twenty times larger than their bottom surfaces. For example, with reference now to FIG. 2, one of the plurality of heat risers 102 that also has heat spreading characteristics, is examined in further detail. In an exemplary embodiment, at least one of the plurality of heat risers 102 is constructed from a highly thermally conductive material, such as a metal block.

In a specific exemplary embodiment, the metal block is fabricated from aluminum. In this specific exemplary embodiment, the heat riser 102 is 3 inches (approximately 7.6 cm) wide by 6 inches (approximately 15.2 cm) long by 1 inch (approximately 2.5 cm) high. A pad area 202 is configured to mount to the CPU 108. The heat riser 102 receives heat from a high heat flux area of the pad area 202 and spreads the heat flux (illustrated by a plurality of dashed arrows 204) over a larger area 203 to reduce the heat flux. A surface area of the larger area 203 is about 10 times larger than a surface area of the pad area 202, thus reducing heat flux proportionately (i.e., by a factor of ten). Reducing the heat flux allows use of thermal interface materials with lower thermal conductivity, while still maintaining a thermal resistance from the electronic component through the lid 111 (or another side of the electronic enclosure 100) of less than about 0.25° C./Watt.

The heat riser 102 is installed in contact with the VLSI component, such as the CPU 108, using the same fixtures as are normally used to hold down a conventional heat sink. In this specific exemplary embodiment, two screws 205 secure the heat riser 102 to the VLSI component.

In other specific exemplary embodiments, the heat riser 102 can be constructed using a simple block of a conducting material such as aluminum or graphite. Each of these, and related materials, may be machined or cast into more complex shapes to optimize performance per unit weight, to fit into limited areas, or to contact multiple heat generating components. Alternately, the heat riser 102 may be fabricated from more complex constructs using, for example, heat pipes.

Figure 3:
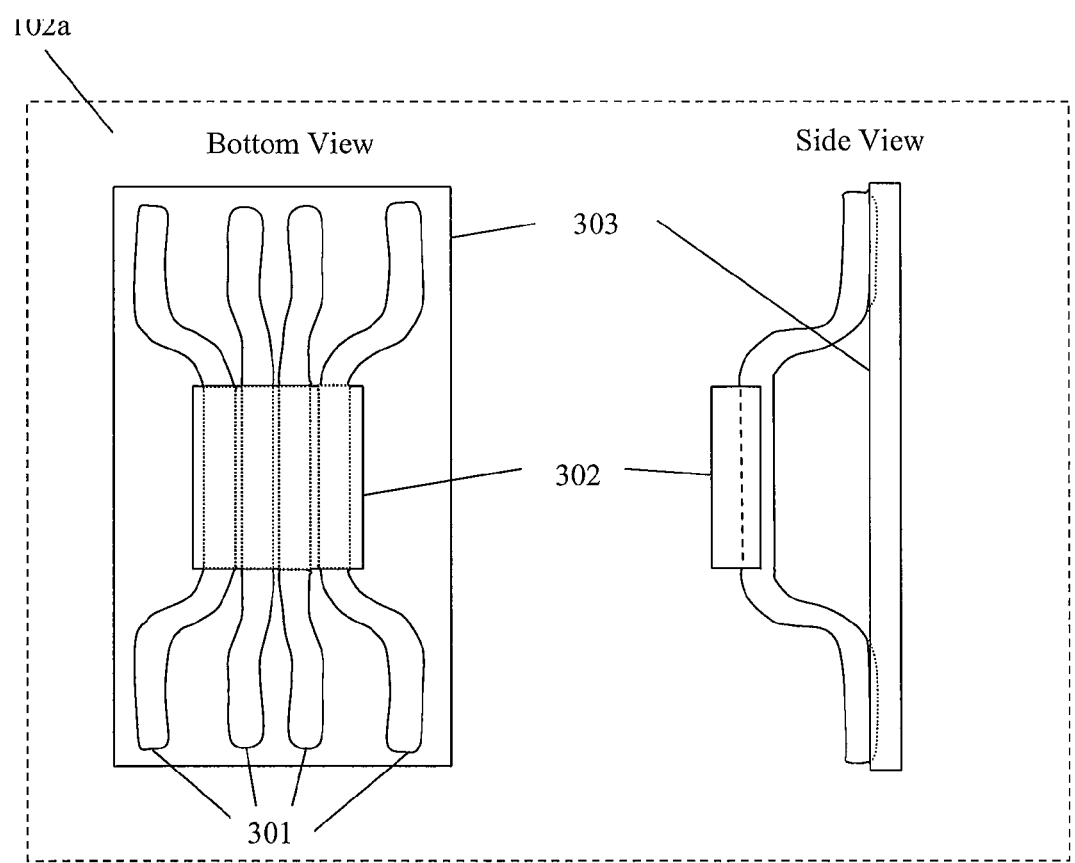
FIG. 3 is a bottom and side view of an exemplary embodiment of a heat-riser/spreader using heat pipes mounted in, for example, metal plates.

Referring to FIG. 3, another exemplary embodiment of a heat riser 102a uses a plurality of heat pipes 301. The plurality of heat pipes 301 may be tubular or solid round, square, or various other shapes and can be fabricated from highly thermally conductive material such as, for example, copper. The plurality of heat pipes 301 are thermally coupled with two or more parallel plates (only two plates are shown for clarity) including a small plate 302 and a large plate 303. The small plate 302 and the large plate 303 can be fabricated from any highly thermally conductive material, such as copper. The small plate 302 is intended for placement on top of the device to be cooled, such as the CPU 108, and the large plate 303 can be placed against the lid 111 of the electronic enclosure 100 (see FIG. 1).

The plurality of heat pipes 301 is arranged so that their center sections are in good thermal contact with the small plate 302 and each of the ends of the plurality of heat pipes 301 are arranged in good thermal contact with the large plate 303. In a specific exemplary embodiment, thermal contact with both the small plate 302 and the large plate 303 is augmented by placing each of the plurality of heat pipes in grooves (not shown explicitly but understandable to a skilled artisan) milled into the small plate 302 and the large plate 303. The grooves are roughly equal in diameter to each of the plurality of heat pipes 301. In another specific exemplary embodiment, each of the plurality of heat pipes 301 is affixed by soldering. Using the design and fabrication techniques described herein, the heat riser 102a has a thermal resistance of less than about 0.07° C./Watt.

A total number of the plurality of heat pipes 301 and dimensions of the small plate 302 and the large plate 303 can be adapted to fit various applications. The larger the large plate 303 in relation to the small plate 302, the greater the reduction in heat flux across the large plate 303. In a specific exemplary embodiment, the small plate 302 has dimensions of about 2 inches by 2 inches (approximately 5.1 cm square) and the large plate has dimensions of about 6 inches by 3 inches (approximately 15.2 cm by 7.6 cm). As the device to be cooled, such as the CPU 108 (see FIG. 1) has a top surface of about 1.3 inches by 1.3 inches (approximately 3.3 cm square), the generated heat flux is effectively spread over an area about ten times greater at the large plate 303 as compared to the small plate 302.

Figure 4:
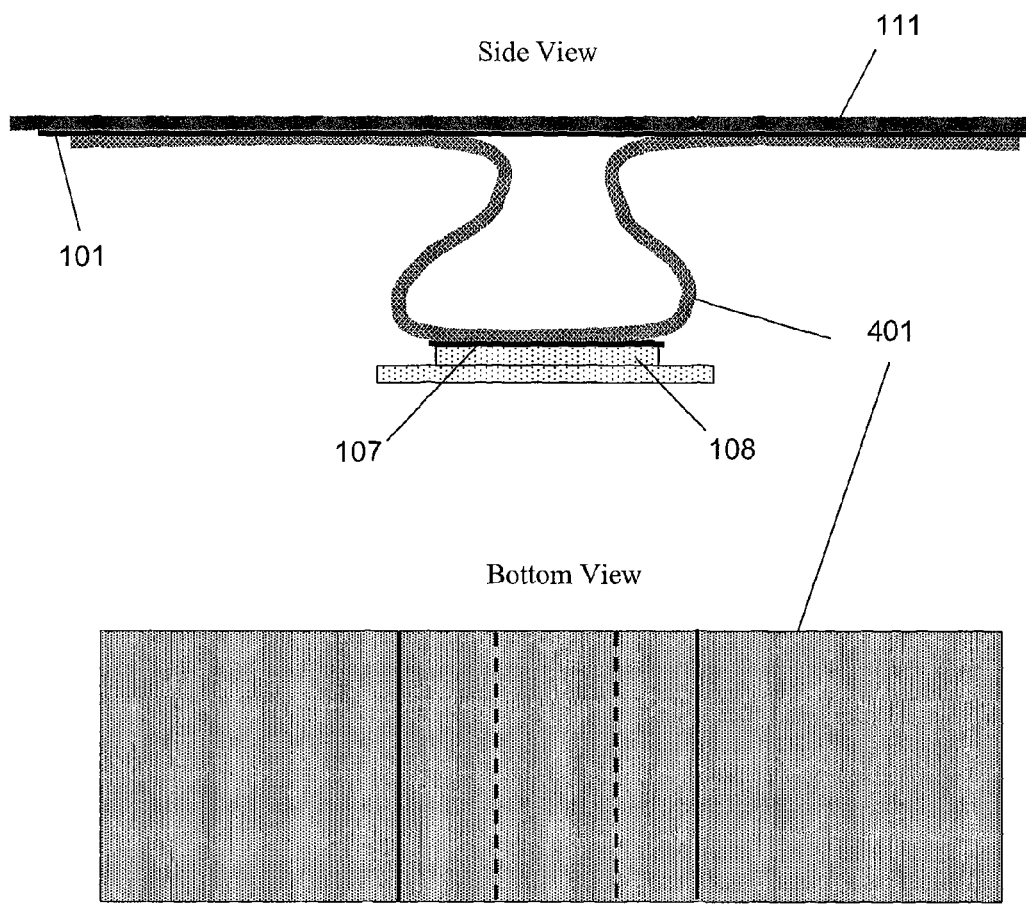
FIG. 4 is a bottom and side view of an exemplary embodiment of a heat-riser/spreader made from a flat heat pipe.

The plurality of heat pipes 301 could be replaced by a single wide flat heat pipe (not shown, but understandable to a skilled artisan). Taking it a step further as illustrated in an exemplary embodiment of FIG. 4, the small 302 and the large 303 plates of FIG. 3 can be eliminated and substituted by a flat, wide heat pipe 401. The flat, wide heat pipe 401 may be used as a heat-riser/spreader all by itself. The flat, wide heat pipe 401 is fabricated from a highly thermally conductive material such as metal (e.g., copper). In a specific exemplary embodiment, the flat, wide heat pipe 401 is 3 inches (approximately 7.6 cm) wide and placed so that its center portion lies directly on top of the device to be cooled, such as the CPU 108, and a large portion of the ends of the flat, wide heat pipe is in contact with the lid 111 of the electronic enclosure 100 (see FIG. 1). Compared to the heat pipe/riser/spreader described above with reference to FIG. 2, thermal performance is slightly better with the flat, wide heat pipe 401 and a lack of coplanarity between the component (e.g., the CPU 108) and the lid 111 can be compensated for by the flexibility of the heat pipe. In other exemplary embodiments (not shown), the flat, wide heat pipe 401 can be used in conjunction with the plurality of heat pipes 301 of FIG. 3.

Heat Risers

In the various exemplary embodiments disclosed above, each of the risers also spreads the heat over a larger area. For components that dissipate less heat than various ones of the high-density integrated circuits discussed above, simpler risers can sufficiently be effective for cooling the components. For example, a simple block heat riser having dimensions of 1 inch by 1 inch by 1 inch (approximately 2.5 cm on a side) can be fabricated from aluminum. Since any face in contact with a component has an opposing face, to be thermally coupled to the lid 111, has as identical surface area, no heat spreading occurs.

Figure 5:
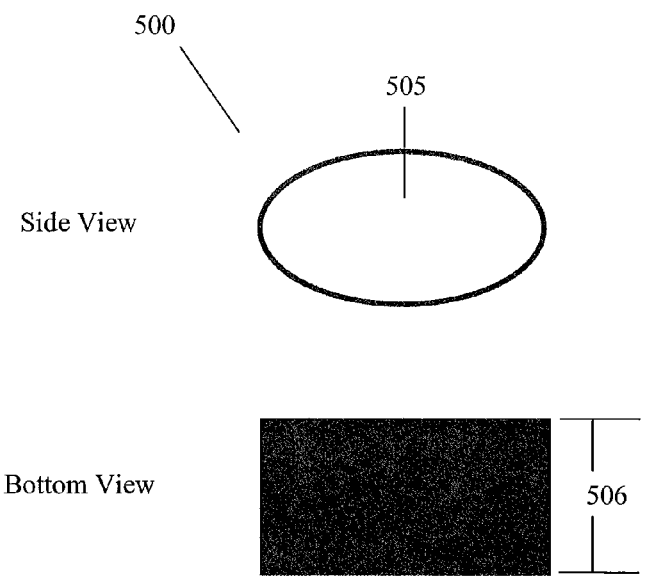
FIG. 5 is a bottom and side view of an exemplary embodiment of spring heat riser.

With reference to FIG. 5, an exemplary embodiment of one type of effective heat riser is a spring riser 500 as illustrated. The spring riser 500 is similar to one of the plurality of heat risers 104 of FIG. 1 and the flat, wide heat pipe 401 of FIG. 4. The spring riser 500 can be constructed out of a highly thermally conductive flexible material such as, for example, copper. The spring riser benefits from being fabricated from an at least slightly resilient material, such as copper, to provide a spring-like characteristic to the spring riser 500.

In a specific exemplary embodiment, the spring riser 500 can be a round or elliptical spring having a width 506 of about 1 inch (approximately 2.5 cm) wide and a thickness 505 of about 5 mils (0.005 inches or approximately 127 microns). However, various shapes other than round can readily be employed as well as other dimensions.

The spring riser 500 removes heat from a component, such as the graphics chip 109 of FIG. 1, by a combination of conduction to the lid 111, and natural convective and radiative heat transfer to a local environment of the component. The spring riser 500 can be affixed to the component by gluing or other means, and has at least one of a plurality of riser TIMs 101 thermally coupling the spring riser 500 to the lid 111. The spring-like nature of the spring riser 500 assures a good mechanical and thermal contact to the lid 111, while automatically compensating for variations in height and coplanarity. The spring riser 500 is light in weight and low in cost. Thermal resistance for an exemplary embodiment of the spring riser 500 described above ranges from about 0.5° C./Watt to 2° C./Watt.

Figure 6:
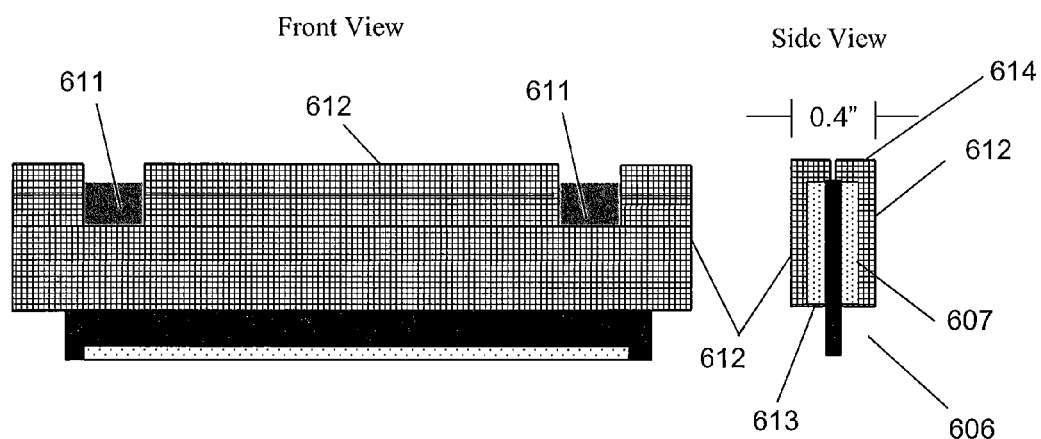
FIG. 6 is a front and side view of an exemplary embodiment of a heat riser usable with a DIMM.

Referring now to FIG. 6, various types of volatile and non-volatile memory subassemblies, such as VRAM or DRAM dual in-line memory modules (DIMMs), can be cooled by conductive heat transfer. In an exemplary embodiment, a DIMM 606, is encased with one or more thermally conductive strips 612 on its sides that act as heat risers. The one or more thermally conductive strips 612 make thermal contact to memory components 613 within the DIMM 606 at a thermal interface 607. The thermal interface 607 can be a thermally conductive grease known independently in the art. Thus, the thermal interface 607 can be a thermal-grease-based TIM.

Vertical sides of the one or more thermally conductive strips 612 provide a low thermal impedance path from the DIMM 606 to an uppermost portion 614 of the one or more thermally conductive strips 612. In a specific exemplary embodiment, a 1 mm thick aluminum block is used for the one or more thermally conductive strips 612. The one or more thermally conductive strips 612 can be held in place by, for example, a plurality of spring clips 611.

In an alternative exemplary embodiment, the one or more thermally conductive strips 612 can be glued to components of the memory components 613 without requiring the plurality of spring clips 611. The glue thus provides both a mechanical and thermal attachment.

The uppermost portion 614 of the one or more thermally conductive strips 612 is substantially orthogonal to the sides and made as wide as a pitch of the DIMM 606 allows (e.g., 0.4 inches or approximately 10 mm), thus minimizing the thermal resistance of the DIMM 606 to an interface of the lid 111 of the electronic enclosure 100 (see FIG. 1). A typical thermal resistance of the interface between the DIMM 606 and the lid 111 is 1.6° C./Watt with 0.2 mm thick TIM. Generally, a worst case thermal resistance is 2° C./Watt for the exemplary embodiment shown, resulting in a temperature rise of approximately 20° C. for a 10 Watt DIMM.

Note that although the one or more thermally conductive strips 612 are shown on both sides of the memory subassembly, in many cases components are mounted on one only side. Thus, in such an application only the single mounted side requires only one of the one or more thermally conductive strips 612.

In a specific application of various embodiments of thermally cooling electronic components described herein, a voltage regulator module (VRM, not shown) converts an internal 12 V power supply to voltages required by the individual components, such as the CPU 108 and the memory 106 (see FIG. 1). The VRM often supplies over 100 amps of current at just over 1 VDC and dissipates up to 30 Watts. In contemporaneous designs, the power is commonly dissipated among six transistors and inductors.

Most server designs have the VRMs built onto the motherboard with the inductors and switching transistors laid out in a row up to 4 inches (approximately 10 cm) long. Consequently, a generated heat flux is relatively low. A piece of metal such as 4 inch long by ⅛ inch thick (approximately 10 cm long by 3.2 mm thick) aluminum strip (not shown) is placed over the transistors and inductors with a thin thermal interface coating there-between. The piece of metal can, in turn, be coupled to the lid 111 of FIG. 1 by one of the plurality of heat risers 102 as shown for the power supply transistor 114, or a solid metal, such as the heat riser 102a of FIG. 3, or one of the spring risers, such as flat, wide heat pipe 401 or the spring riser 500, of FIGS. 4 and 5 respectively, can be employed to thermally rise and couple the aluminum strip to the lid 111.

In another specific application of various embodiments of thermally cooling electronic components described herein, an input power converter converts input power to a lower intermediate voltage, nominally 12 VDC. Power is delivered to a motherboard through one or more electrical connectors. Input power converter subassemblies are mounted (not shown), typically by screws, directly to the lid 111 of the electronic enclosure 100. A layer of thermal interface material between the cover and the device ensures good thermal contact.

In another specific application of various embodiments of thermally cooling electronic components described herein, disk drives (not shown) consume about 10 Watts so adequate cooling is typically achieved by conductive and natural convective heat transfer within an enclosure. Cooling of the disk drives can be enhanced by inserting, for example, a TIM 113 such as was done for the motherboard 110 of FIG. 1 between the disk drive and the electronic enclosure 100.

Figure 7:
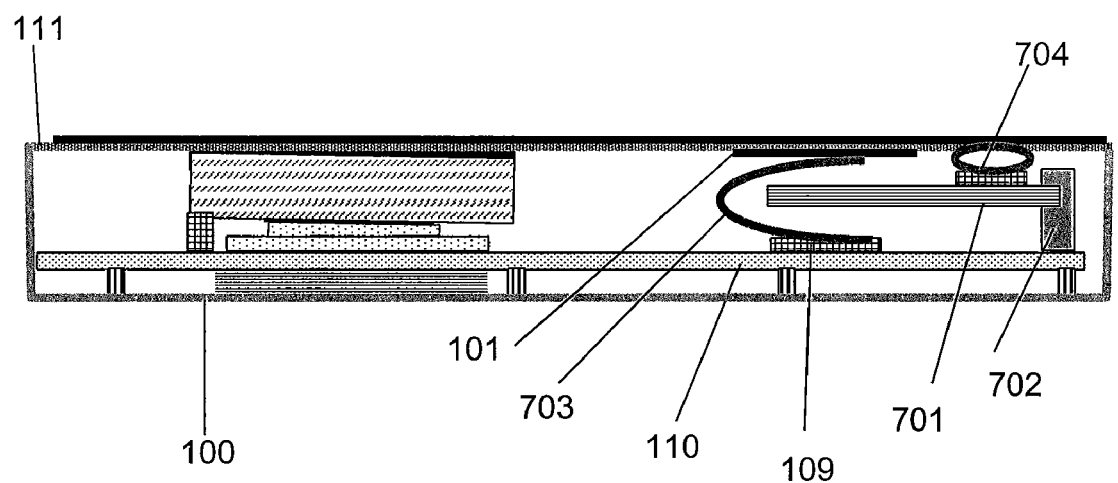
FIG. 7 is a cross-sectional drawing illustrating an exemplary embodiment of an enclosure with an auxiliary card and a motherboard.

In another specific application of various embodiments of thermally cooling electronic components described herein, auxiliary circuit board subassemblies generally have low dissipation (e.g., below 30 Watts) and just a few integrated circuit components. With reference to FIG. 7, in a 1U-sized system, an auxiliary circuit board 701 is commonly inserted into the motherboard 110 so that the auxiliary circuit board 701 is coplanar with and slightly above the motherboard 110 as illustrated. Components mounted to the auxiliary circuit board 701 can be cooled via an aluminum block or a spring riser 704 glued, coupled, or otherwise adhered on top of the components and coupled to the lid 111 of the electronic enclosure 100 in a fashion similar to that described for other devices, above.

Further, a plurality of auxiliary circuit boards (not shown explicitly) can be placed in an area previously occupied by fans and associated control mechanisms normally used for forced-air convective cooling. The plurality of auxiliary circuit boards can be connected to the motherboard with high speed interfaces such as HyperTransport®, PCI Express®, or any other similar widely accepted protocol. Mounting the plurality of auxiliary circuit boards in an area previously occupied by fans and associated control mechanisms enables a 1U enclosure to offer the same functionality as a 2U, 3U, or 4U enclosure.

Other objects, such as the auxiliary circuit board subassemblies described immediately above, may obstruct a direct thermal path between the motherboard 110 component and the lid 111. In such a case, heat generated by the component are directed around the obstruction. For example and with continuing reference to FIG. 7, a component, such as the graphics chip 109, no longer has a direct unobstructed path to the lid 111. The auxiliary circuit board 701 (plugged into a socket 702) lies directly above the graphics chip 109. In this case, an exemplary half spring riser 703 has one end in thermal contact with the graphics chip 109, wraps around the auxiliary circuit board 701, and thermally contacts at least one of the plurality of riser TIMs 101 under the lid 111. For medium and lower power devices, the half spring riser 703 can be a simple strip of copper as described above for one of the spring risers, such as the spring riser 500 of FIG. 5. If a lower thermal resistance is required, the half spring riser 703 can be constructed much like the flat, wide heat pipe 401 described with reference to FIG. 4.

Alternatively, the half spring riser 703 can be fabricated from a heavier gauge thermally-conductive material or even a block of metal cut in such a fashion as to extend out from under the obstruction and rise to the lid 111. In another exemplary embodiment, a TIM (not shown) may be inserted under the obstructed component in order to conduct heat to the enclosure bottom as referred to above. The variations described are not all not shown as they are too numerous to itemize and are readily apparent to one skilled in the art using the disclosure and embodiments provided herein.

Heat Riser Planarization

After thermal risers are attached to many or all components within the electronic enclosure 100, thus bringing the thermal risers nominally up to a level of a lower portion on the underside of the lid 111, a planarization step can be included further enhancing thermal coupling to the lid 111 with a low thermal resistance.

Assembly of the motherboard 110 may result in the top portions of the components not being coplanar either with one another or an uppermost portion of heat risers attached thereto not being coplanar with the lower portion of the underside of the lid 111. Consequently, the upper portions of the attached heat risers may not be at an exact distance below the lid 111. For example, an integrated circuit may have dimensions of 33 mm×33 mm with an installed height variance of roughly 0.2 mm, and a surface coplanarity variance of about 0.3 mm between either of the two sets of parallel faces. A top face or surface of, for example, the larger area 203 of one of the plurality of heat risers 102 (see FIG. 2), multiplies an effect of the variation simply due to the increased surface area. Moreover, both the motherboard 110 and the electronic enclosure 100 are flexible and can sag away from their respective support structures. In this example, coplanarity variance can be up to roughly 1.4 mm or more.

While any of the various spring risers described herein are flexible, and will therefore adjust to variations in height and planarity automatically, the tops of larger risers/spreaders (e.g., one of the plurality of heat risers 102) can benefit from planarization and a resulting height adjustment thus assuring good, low-thermal resistance coupling to the lid 111. Ordinary rubber-like TIM sheet materials of the prior art do not have sufficient compliance to overcome large coplanarity differences.

Several methods may be employed to offset a lack of coplanarity. In an exemplary embodiment, a compliant thermally conductive substance, such as a thermal grease, known independently in the art, can improve conductive heat transfer between contacting surfaces. Additionally, a self-leveling thermally conductive potting compound may be poured in a mask over the riser and allowed to set. In another exemplary embodiment, a thermal grease or thermally conducting potting compound may be encapsulated in a bag and laid over one or a plurality of risers, functioning as at least one of the plurality of riser TIMs 101. The bag of this exemplary embodiment is described in detail with reference to FIG. 8, below. Self-leveling thermally conductive potting compounds are known independently in the art.

In a specific exemplary embodiment, an uppermost top portion of the heat riser 102 is covered with a moderately high conductivity (e.g., 3 Watts/m-° K.) potting compound prior to replacing the lid 111 on the electronic enclosure 100. The potting compound is cured in place between the heat riser 102 and the lid 111. The cured potting compound then functions as at least one of the plurality of riser TIMs 101 described above with a thermal impedance of less than about 0.1° C./Watt/in$^2$ (approximately 0.016° C./W/cm$^2$).

Further, since contacting surfaces between the top of risers/spreaders and the underside of the lid 111 are never perfectly flat or coplanar, and may even be non-rigid and flexible, thermal grease or an elastomeric pad (known separately and independently in the art), may be inserted between the contacting surfaces. Alternatively or in addition, the riser may be physically clamped to the lid by a screw or clamping fixture, or otherwise adhered (e.g., by an epoxy or chemical bonding agent), using a generally inherent flexibility of the motherboard 110 and the lid 111 to compensate for non-coplanarity and height variations. The flexibility of the motherboard 110 can compensate for some or all the height and coplanarity issues. After mounting the heat riser 102 on the component to be cooled and replacing the lid 111, the heat riser 102 is clamped to the lid 111 in order to draw the heat riser 102 against it. Thermal resistance is minimized by flattening the heat riser 102 against the lid 111 and minimizing a thickness of one or more of the plurality of riser TIMs 101. Screwing or locking sliders (not shown but readily understood by a skilled artisan) are one form of attachment but other attachment methods will work. The clamping process can benefit from a rigid enclosure lid capable of remaining relatively flat when force is applied thereto. The heat riser 102 is lifted into contact with the rigid lid and the motherboard 110 is flexed to compensate for any mechanical height differences due to, for example, dimensional tolerances of the various components such as the lid, motherboard, heat riser, etc.).

In another exemplary embodiment, any of the risers or spreaders are patterned (not shown but readily understandable to a skilled artisan) on an uppermost portion (i.e., that portion configured to contact the lid 111). A portion of the lid 111, corresponding to a contact point of the patterned riser or spreader, is similarly patterned to engage with the riser or spreader pattern. The patterned surface increases an overall surface area of the contacting surfaces, thus increasing the thermal contact area. Patterning of opposing surfaces brought into contact with one another is discussed in more detail with reference to FIG. 9, below.

In another exemplary embodiment, a compliant thermally-conducting foam (not shown) can function as at least one of the plurality of riser TIMs 101. The compliant thermally conducting foam is compressed by the lid 111 providing coplanarity between the heat riser 102 and the lid 111. The compliant thermally conducting foam is useful in situations where planarity divergence is small or relatively high pressures can be applied to press down the lid 111.

In yet another exemplary embodiment, a flexible vapor chamber (not shown) fabricated from a resilient and thermally conductive material can be clamped to the riser or device to be cooled. A pressure-cooker-effect is then utilized to expand a top of the vapor chamber top into planarity with the lid 111, thus providing enhanced conductive heat transfer. A skilled artisan will recognize that any or all of the methods and means described above can be combined for various applications.

Figure 8:
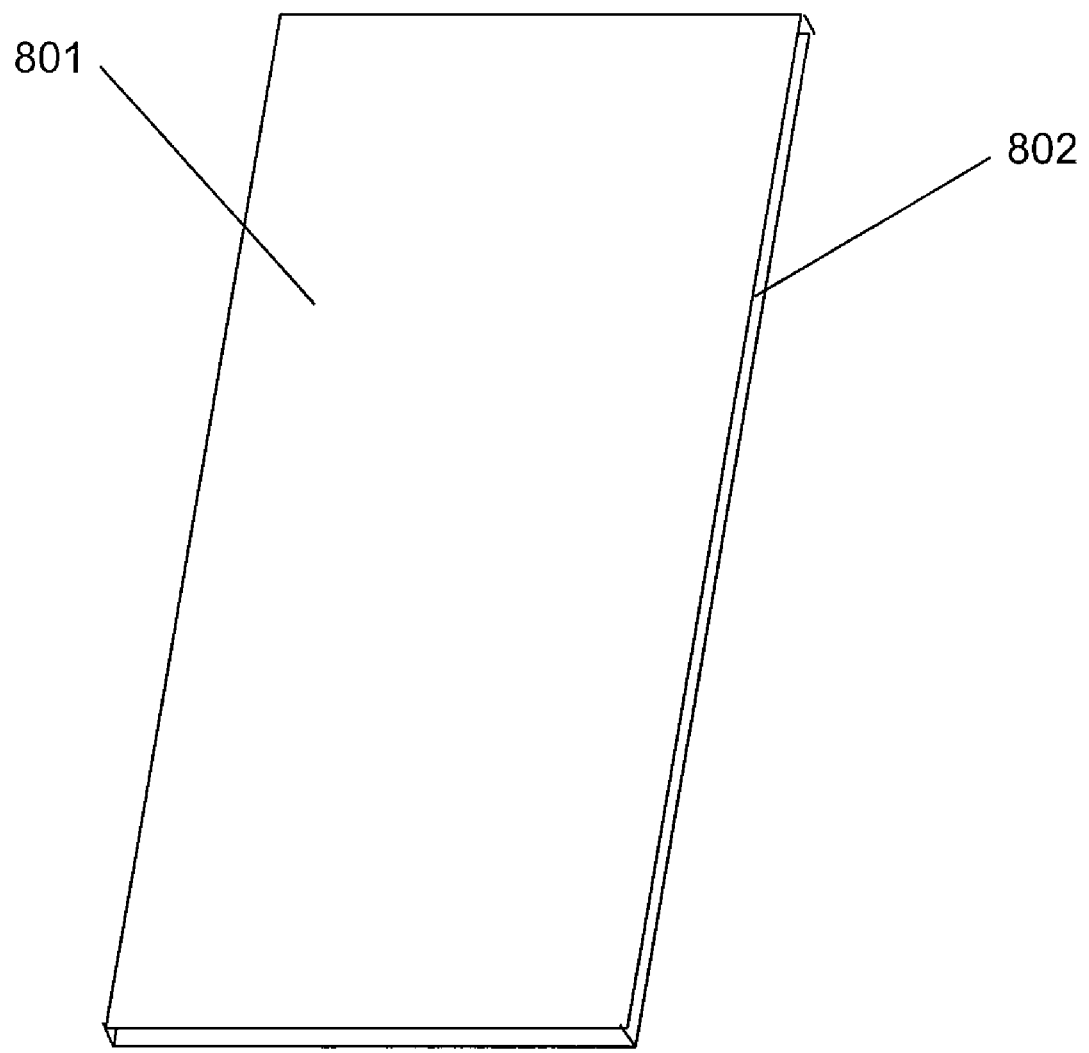
FIG. 8 is an isometric view of an exemplary embodiment of a planarization TIM bag.

With reference now to FIG. 8, a bag 801, discussed briefly above, is filled with a self-leveling thermally conductive fluid 802 (note that the thermally conductive fluid 802 is contained within the bag 801). The fluid can be, for example, a thermal grease. Various types of thermal grease are known independently in the art. For a single riser, the bag 801 can be fabricated to be slightly larger than a top surface of the riser, for example, from about 5% to 20% larger on a side. For example, for the 3 inch by 6 inch (approximately 7.6 cm by 15.2 cm) dimension of the larger area 203 of the heat riser 102 (see FIG. 2) discussed above, the bag can be 3.3 inches by 6.6 inches (approximately 8.4 cm by 16.8 cm). The bag 801 can be sized large enough to allow an excess amount of the thermally conductive fluid 802 a place to escape when the fit is tight, but not so large that much of the thermally conductive fluid 802 will flow away beyond one or more edges of the heat riser 102, thus leaving a void above the heat riser 102. An amount of the thermally conductive fluid 802 used in the bag 801 is dependent upon a worst-case coplanarity variation, as described above. The bag 801 could also be large enough to cover a multiplicity of components, simply covering over many or all of the components. In another exemplary embodiment, the bag 801 can act as the lid 111 of the electronic enclosure 100.

In a specific exemplary embodiment, the bag 801 can be fabricated using a dual-layer polyester and aluminum construction. This embodiment is described with reference to the specific exemplary embodiment of constructing the compliant TIM 103 discussed above. For the bag 801, the dual-layers can be filled with various types of fluid such as the thermally conductive fluid 802. In a related specific exemplary embodiment, one of the layers of the bag can be the lid 111 of the electronic enclosure 100. The second of the dual-layers is coupled to the lid 111 so as to form a cavity between the lid 111 and the second of the dual-layers. The second of the dual-layers can be comprised substantially of either, for example, aluminum or polyester. In this case, the bag 801 can be in contact with one surface of the entire lid 111 or, alternatively, in contact with only certain portions. Of course, multiple instantiations of the bag 801 can be in contact with different areas of the lid 111 as well. Additionally either of the dual-layers can be comprised of any other material that is generally non-reactive when in contact with the thermally conductive fluid 802 or thermal greases and has a relatively good thermal conductivity. Additionally, the materials for the dual-layers should be relatively impervious to leaks when used to encapsulate various types of fluid such as the thermally conductive fluid 802. In other exemplary embodiments where the bag 801 comes into contact with the lid 111, there should be a good thermal contact between the bag 801 and the lid 111.

In another exemplary embodiment, the bag 801 can be fabricated using a dual-layer polyester and aluminum construction on one side with the other side comprising the lid 111 of the electronic enclosure 100 (see FIG. 1). The dual-layer polyester and aluminum construction side is affixed to the lid 111 by gluing or other means. This embodiment is described with reference to the specific exemplary embodiment of constructing the compliant TIM 103 discussed above. For the bag 801, the space between the dual-layers and the lid 111 can be filled with various types of fluid as the thermally conductive fluid 802.

The thermally conductive fluid 802 can either be a setting or non-setting compound depending upon a specific application. For example, if components within the electronic enclosure 100 are changed over the life of the equipment, a non-setting compound is adaptable to the new dimensions of one or more new components. However, a setting compound is less likely to leak or otherwise fail than a non-setting compound. Thus, the setting compound can be better suited for applications that are not modified.

In a specific exemplary embodiment, the bag 801 is utilized to achieve the pressure-cooker effect, describe above. This specific exemplary embodiment is similar to the aforementioned technique of encapsulating thermal grease or thermally conducting potting compound in a bag. However, with the pressure-cooker effect, the bag 801 is fabricated from a flexible and thermally conductive material. The bag 801 is evacuated, except for a small amount of the thermally conductive fluid 802 that boils just above the cold plate operating temperature. The bag 801, acting as a vapor chamber, is affixed to the heat riser 102. When the bag 801 cools, it is compressed flat by the lack of vapor-counteracting air pressure. When the heat riser 102 starts to conduct heat, the bag 801 warms up until the thermally conductive fluid 802 boils, expanding the bag 801 and forcing it tightly against the lid 111. At that point, the thermally conductive fluid 802 at the top of the bag 801 that is in thermal contact with the lid 111 cools and condenses, thus releasing heat into the lid 111. In this manner, heat is transferred from the heat riser 102 to the lid 111.

Figure 9:
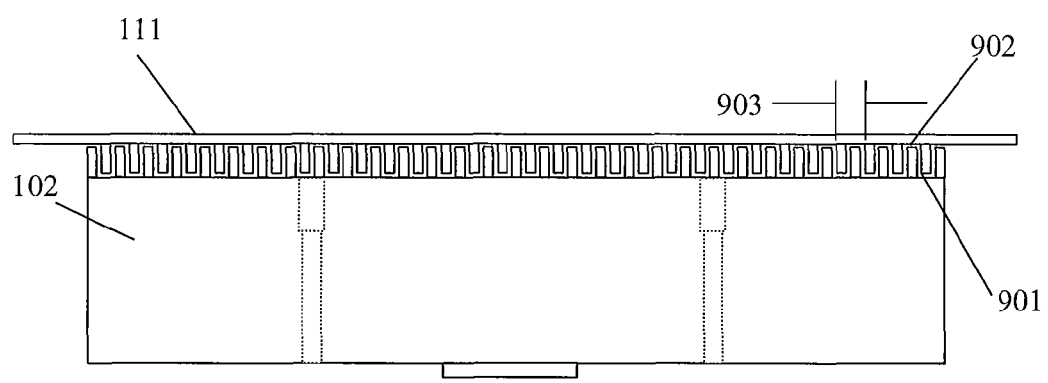
FIG. 9 illustrates an exemplary embodiment of a grooved interface between a between heat riser and a lid.

Referring now to FIG. 9, an exemplary embodiment of a grooved interface between the heat riser 102 and the lid 111 exemplifies one of the techniques described above to compensate for a lack of coplanarity. In this exemplary embodiment, the heat riser 102 is patterned with a plurality of grooves 901. The plurality of grooves 901 engages a plurality of corresponding grooves 902 formed into a lower portion of the lid 111.

In a specific exemplary embodiment, each of the plurality of grooves 901 and the plurality of corresponding grooves 902 are formed to a depth of 3 mm with a groove pitch 903 of 1 mm, along the z-axis (the z-axis being defined as being orthogonal to the drawing), such that a width of each "tooth" is slightly less than one half the groove pitch 903. This ratio assures some skew tolerance in the x-axis as well as the y- and z-axes. However, the width of the teeth can vary between the plurality of grooves 901 and the plurality of corresponding grooves 902 or even from tooth-to-tooth. The only requirement is that the two components properly mate such that a surface area, and a resulting convective heat transfer, increases. When the lid 111 is replaced, the two sets of grooves mesh and, because of the skew tolerance, compensation is made between a lack of coplanarity between the heat riser 102 and the lid 111.

The grooved surfaces thus assure a larger interface area for a lower thermal resistance between the heat riser 102 and the lid 111. The grooved surfaces may be manufactured as part of the heat riser 102 and the lid 111, or they may be separate pieces of thermally conductive material applied to either or both surfaces. To further increase convective heat transfer between the mating surfaces, either thermal grease is applied between the surfaces to effect a low thermal resistance or one or both surfaces can include a compliant and thermally conductive TIM. Using the teachings herein, one skilled in the art will realize other depths, pitches, and interlocking patterns other than grooves, (e.g., a checkerboard pattern), may also be used in different applications.

Lid Modifications and Lidless Enclosures

In the various embodiments described herein, heat risers are used as a thermal path between one or more of the various components to be cooled and an enclosure lid. In an exemplary embodiment, to properly couple heat from the top of the heat riser to the cold plate through the lid utilizes, for example, at least two of the plurality of riser TIMs 101 or the compliant TIM 103 as shown in FIG. 1. In high power applications, such as a 200-Watt CPU, or when it is desirous to have the temperature difference between the component and the cold plate lower, the two layers of TIM may add too much thermal resistance. In such a case, the lid may be modified or eliminated.

In the first case where the lid is modified, holes are cut through the lid to match sizes of one or more of the heat-risers or spreaders. The heat-risers/spreaders are made slightly taller than described in other embodiments, above, so the heat-riser/spreaders poke through the lid and are level with an outside portion of the top of the lid. A single layer of TIM is then added to the top of the riser that is then directly coupled to an external cold plate through this single TIM layer.

In the second case where the lid is completely eliminated, the bag 801 of FIG. 8 above is designed to fit over the top of all the heat riser components, thereby replacing and eliminating the lid. In applications where the lid is used for other purposes, such as Faraday shielding for EMI, the bag 801 can be metalized and electrically coupled to the enclosure to provide for electrical isolation. This technique is also applicable to blade servers. Moreover, to spread heat better across the lid, the lid itself, or a portion thereof, may be constructed as a flat heat pipe or vapor chamber using techniques described above.

Although various embodiments have been described herein, it will be evident that various modifications and changes may be made to these embodiments without departing from the broader spirit and scope of various forms of the present invention. Accordingly, the specification and drawings are to be regarded in an illustrative rather than a restrictive sense. The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually or collectively, by the term "invention" merely for convenience and without intending to voluntarily limit the scope of this application to any single invention or inventive concept if more than one is, in fact, disclosed. Thus, although specific embodiments have been illustrated and described herein, it should be appreciated that any arrangement calculated to achieve the same or similar purposes may be substituted for the specific embodiments shown. This disclosure is intended to cover any and all adaptations or variations of the various embodiments. Combinations of the above embodiments, and other embodiments not specifically described herein, will be apparent to those of skill in the art upon reviewing the above description.

For example, particular embodiments describe various arrangements, dimensions, materials, and topologies of systems. Such arrangements, dimensions, materials, and topologies are provided to enable a skilled artisan to comprehend principles of the present disclosure. Thus, for example, numerous other materials and arrangements may be readily utilized and still fall within the scope of the present disclosure. Additionally, a skilled artisan will recognize, however, that additional embodiments may be determined based upon a reading of the disclosure given herein.

What is claimed is:

1. A system to provide cooling to an electronic component mounted in an electronic enclosure, the system comprising:
   a cold plate to thermally conduct heat and being configured to mount on the electronic enclosure, the cold plate having a first surface to mount proximate to the electronic component and a second surface to mount distal from the electronic component;
   a heat riser, the heat riser having a first end thermally coupled to the first surface of the cold plate and a second end thermally coupled to the electronic component, wherein the heat riser is fabricated from a heat pipe affixed to a first thermally conductive plate and a second thermally conductive plate, the first thermally conductive plate being thermally coupled to each end of the heat pipe and the second thermally conductive plate being thermally coupled to another portion of the heat pipe;
   a thermal interface material comprising:
      a first layer thermally coupled to the first surface of the cold plate; and,
      a second layer, the second layer joined to the first layer and thermally coupled to the electronic component.

2. The system of claim 1, wherein the electronic enclosure is a standard 1U type of electronic enclosure.

3. The system of claim 1, wherein the cold plate is fabricated from a thermally conductive material and forms a lid for the electronic enclosure.

4. The system of claim 1, wherein the first end of the heat riser has a first surface area, the second end of the heat riser having a second surface area that is larger than the first surface area.

5. The system of claim 4, wherein the first surface area is approximately two to twenty times larger than the second surface area.

6. The system of claim 1, wherein a thermal resistance between the electronic component and the cold plate is less than 0.25° C. per Watt.

7. The system of claim 1, wherein the heat riser has an overall length of approximately 2.3 cm to 3.3 cm.

8. The system of claim 1, wherein the heat pipe comprises a flat heat pipe.

9. The system of claim 1, wherein the heat riser is a spring riser fabricated from a flexible thermally conductive material.

10. The system of claim 9, wherein the spring riser has a thermal resistance within a range of about 0.5° C. per Watt to about 2° C. per Watt.

11. The system of claim 1, wherein the thermal interface material forms a bag filled with thermally conductive fluid.

12. The system of claim 11, wherein the thermally conductive fluid is a self-leveling fluid.

13. The system of claim 11, wherein the bag is metalized to provide EMI shielding.

14. A system to provide cooling to an electronic component mounted in an electronic enclosure, the system comprising:
   a cold plate to thermally conduct heat and being configured to mount on the electronic enclosure, the cold plate having a first surface to mount proximate to the electronic component and a second surface to mount distal from the electronic component;
   a heat riser, the heat riser having a first end thermally coupled to the first surface of the cold plate and a second end thermally coupled to the electronic component;
   a thermal interface material comprising:
      a first layer thermally coupled to the first surface of the cold plate; and
      a second layer, the second layer joined to the first layer and thermally coupled to the electronic component; and
   a thermally conducting potting compound applied between the heat riser and the cold plate.

15. The system of claim 14, wherein the thermal impedance of the thermally conducting potting compound is less than about $0.016°$ C./W/cm$^2$.

16. The system of claim 1, further comprising a self-leveling thermally conductive fluid encapsulated within a bag, the bag providing a thermal interface and planarization structure over the heat riser.

17. The system of claim 16, wherein a portion of the bag thermally coupled with the heat riser has an area approximately 5% to 20% the surface area of the first end of the heat riser.

18. The system of claim 1, wherein the first end of the heat riser is adhered to the cold plate.

19. The system of claim 1, wherein the cold plate is a flexible vapor chamber, the flexible vapor chamber being fabricated from a resilient and thermally conductive material and encapsulating a thermally conductive fluid, wherein heat produced at the first surface of the cold plate is moved to the second surface of the cold plate by a closed loop vapor cycle in the cold plate by using the thermally conductive fluid.

20. The system of claim 1, wherein the first end of the heat riser is patterned to engage a mating pattern on the first surface of the cold plate.

21. The system of claim 20, wherein the pattern includes a thermally conductive interface material.

22. The system of claim 1, wherein the
cold plate is configured to be mounted external to the electronic enclosure;
the system further comprising a lid mounted on the electronic enclosure, the lid having a first surface to mount proximate to the electronic component and a second surface to mount distal from the electronic component, the lid further comprising a hole positioned to accommodate the heat riser to mount therethrough; wherein the thermal interface material thermally couples the first end of the heat riser to the cold plate.

23. A system to provide cooling to an electronic component mounted in an electronic enclosure, the system comprising:
a cold plate to thermally conduct heat and configured to mount to the electronic enclosure, the cold plate having a first surface to mount proximate to the electronic component and a second surface to mount distal from the electronic component;
a heat riser, the heat riser having a first end thermally coupled to the first surface of the cold plate and a second end thermally coupled to the electronic component;
a thermal interface bag comprising:
  a first layer thermally coupled to the first surface of the cold plate; and,
  a second layer joined to the first layer and thermally coupled to the electronic component;
  a third porous layer fabricated between the first layer and the second layer to provide strength to the thermal interface bag; and
  a thermally conductive fluid encapsulated within the bag, wherein the third porous layer is configured to allow the thermally conductive fluid to move therethrough.

24. The system of claim 11, wherein the first layer is substantially comprised of aluminum and the second layer is substantially comprised of polyester.

25. The apparatus of claim 11, wherein each layer of the bag is approximately 18 microns in thickness.

26. The apparatus of claim 11, wherein the thermal interface material is a lid of an electronic enclosure.

27. The apparatus of claim 11 further comprising a layer of thermal grease between the thermal interface material and the electronic component, and a second layer of thermal grease between the thermal interface material and the cold plate.

28. The apparatus of claim 1, wherein the heat pipe comprises a plurality of heat pipes.

29. The system of claim 1, wherein the heat riser is a rectangular prism comprising metal.

* * * * *

UNITED STATES PATENT AND TRADEMARK OFFICE
CERTIFICATE OF CORRECTION

| | | |
|---|---|---|
| PATENT NO. | : 8,270,170 B2 | Page 1 of 1 |
| APPLICATION NO. | : 12/535272 | |
| DATED | : September 18, 2012 | |
| INVENTOR(S) | : Hughes et al. | |

It is certified that error appears in the above-identified patent and that said Letters Patent is hereby corrected as shown below:

Title page, item [75] Inventor: "Robert J. Lipps" should read --Robert J. Lipp--

Signed and Sealed this

Thirteenth Day of November, 2012

David J. Kappos
*Director of the United States Patent and Trademark Office*